United States Patent
Yen et al.

(10) Patent No.: US 9,024,437 B2
(45) Date of Patent: May 5, 2015

(54) CHIP PACKAGE AND METHOD FOR FORMING THE SAME

(76) Inventors: Yu-Lin Yen, Taipei (TW); Chien-Hui Chen, Zhongli (TW); Tsang-Yu Liu, Zhubei (TW); Yen-Shih Ho, Kaohsiung (TW)

( * ) Notice: Subject to any disclaimer, the term of this patent is extended or adjusted under 35 U.S.C. 154(b) by 0 days.

(21) Appl. No.: 13/524,985

(22) Filed: Jun. 15, 2012

(65) Prior Publication Data
US 2012/0319297 A1    Dec. 20, 2012

Related U.S. Application Data

(60) Provisional application No. 61/497,850, filed on Jun. 16, 2011.

(51) Int. Cl.
*H01L 23/48* (2006.01)
*H01L 21/78* (2006.01)
*H01L 23/31* (2006.01)

(52) U.S. Cl.
CPC ......... *H01L 23/3128* (2013.01); *H01L 23/3114* (2013.01); *H01L 23/481* (2013.01); *H01L 2224/131* (2013.01); *H01L 2224/02372* (2013.01); *H01L 2224/05548* (2013.01); *H01L 2224/13022* (2013.01); *H01L 2224/13024* (2013.01); *H01L 2924/1461* (2013.01); *H01L 2224/0401* (2013.01)

(58) Field of Classification Search
CPC .............. H01L 23/3128; H01L 23/481; H01L 2224/02372; H01L 2224/05548; H01L 2224/13022; H01L 2224/13024; H01L 2224/131; H01L 23/3114; H01L 2924/1461

USPC .......................................... 257/730; 438/667
See application file for complete search history.

(56) References Cited

U.S. PATENT DOCUMENTS

| | | | | |
|---|---|---|---|---|
| 5,610,440 A | * | 3/1997 | Isozaki | 257/713 |
| 6,605,492 B2 | * | 8/2003 | Barrett | 438/126 |
| 6,777,767 B2 | * | 8/2004 | Badehi | 257/432 |
| 8,003,442 B2 | * | 8/2011 | Yen et al. | 438/116 |
| 8,207,615 B2 | * | 6/2012 | Lou et al. | 257/774 |
| 8,399,963 B2 | * | 3/2013 | Tsai et al. | 257/620 |
| 8,409,925 B2 | * | 4/2013 | Lee et al. | 438/110 |
| 2003/0124762 A1 | * | 7/2003 | Hashimoto | 438/67 |
| 2004/0137701 A1 | * | 7/2004 | Takao | 438/461 |
| 2005/0161805 A1 | * | 7/2005 | Ono et al. | 257/704 |
| 2008/0230860 A1 | * | 9/2008 | Yen et al. | 257/433 |
| 2008/0258168 A1 | | 10/2008 | Loh et al. | |
| 2008/0284041 A1 | * | 11/2008 | Jang et al. | 257/774 |
| 2010/0276774 A1 | * | 11/2010 | Yen et al. | 257/433 |

(Continued)

FOREIGN PATENT DOCUMENTS

| | | |
|---|---|---|
| CN | 101996953 | 3/2011 |
| CN | 102034796 | 4/2011 |

*Primary Examiner* — Earl Taylor
(74) *Attorney, Agent, or Firm* — Liu & Liu

(57) ABSTRACT

An embodiment of the invention provides a chip package which includes: a substrate having a plurality of sides and a plurality of corner regions, wherein each of the corner regions is located at an intersection of at least two of the sides of the substrate; a device region formed in the substrate; a conducting layer disposed on the substrate and electrically connected to the device region; an insulating layer disposed between the substrate and the conducting layer; and a carrier substrate, wherein the substrate is disposed on the carrier substrate, and the substrate has a recess extending towards the carrier substrate in at least one of the corner regions.

19 Claims, 5 Drawing Sheets

(56) References Cited

U.S. PATENT DOCUMENTS

| | | | |
|---|---|---|---|
| 2011/0079892 A1* | 4/2011 | Tsai et al. | 257/700 |
| 2011/0156074 A1* | 6/2011 | Liu et al. | 257/98 |
| 2011/0156191 A1* | 6/2011 | Lin et al. | 257/433 |
| 2011/0170303 A1* | 7/2011 | Wu et al. | 362/382 |
| 2011/0175236 A1* | 7/2011 | Lou et al. | 257/774 |
| 2011/0193241 A1* | 8/2011 | Yen et al. | 257/774 |
| 2011/0210413 A1* | 9/2011 | Huang et al. | 257/433 |
| 2011/0221070 A1* | 9/2011 | Yen et al. | 257/774 |
| 2011/0278734 A1* | 11/2011 | Yen et al. | 257/774 |
| 2011/0278735 A1* | 11/2011 | Yen et al. | 257/774 |
| 2011/0285032 A1* | 11/2011 | Yen et al. | 257/774 |
| 2011/0298000 A1* | 12/2011 | Liu et al. | 257/99 |
| 2012/0049307 A1* | 3/2012 | Huang et al. | 257/432 |
| 2012/0056226 A1* | 3/2012 | Hung et al. | 257/98 |
| 2012/0112329 A1* | 5/2012 | Yen et al. | 257/666 |
| 2012/0133049 A1* | 5/2012 | Lin et al. | 257/774 |
| 2012/0146108 A1* | 6/2012 | Chang et al. | 257/288 |
| 2012/0146111 A1* | 6/2012 | Chang et al. | 257/288 |
| 2012/0146153 A1* | 6/2012 | Wen et al. | 257/368 |
| 2012/0168939 A1* | 7/2012 | Chang et al. | 257/737 |
| 2012/0181672 A1* | 7/2012 | Lou et al. | 257/621 |
| 2012/0184070 A1* | 7/2012 | Chen et al. | 438/114 |
| 2012/0261809 A1* | 10/2012 | Yen et al. | 257/684 |
| 2012/0267780 A1* | 10/2012 | Chen et al. | 257/737 |
| 2012/0292744 A1* | 11/2012 | Liu et al. | 257/620 |
| 2012/0313222 A1* | 12/2012 | Lee et al. | 257/620 |
| 2012/0313261 A1* | 12/2012 | Lee et al. | 257/777 |
| 2012/0319297 A1* | 12/2012 | Yen et al. | 257/774 |
| 2013/0020700 A1* | 1/2013 | Liu et al. | 257/737 |
| 2013/0119556 A1* | 5/2013 | Liu et al. | 257/774 |

* cited by examiner

CHIP PACKAGE AND METHOD FOR FORMING THE SAME

CROSS REFERENCE TO RELATED APPLICATIONS

This application claims the benefit of U.S. Provisional Application No. 61/497,850, filed on Jun. 16, 2011, the entirety of which is incorporated by reference herein.

BACKGROUND OF THE INVENTION

1. Field of the Invention

The invention relates to a chip package, and in particular relates to chip packages formed by using a wafer-level packaging process.

2. Description of the Related Art

The chip packaging process is an important process when fabricating an electronic product. Chip packages not only provide chips with protection from environmental contaminants, but also provide an interface for connection between electronic elements in the chips and electronic elements outside of the chip package.

In order to improve reliability and performance of the chip packages, improved chip packages and fabrication processes thereof are desired.

BRIEF SUMMARY OF THE INVENTION

An embodiment of the invention provides a chip package which includes: a substrate having a plurality of sides and a plurality of corner regions, wherein each of the corner regions is located at an intersection of at least two of the sides of the substrate; a device region formed in the substrate; a conducting layer disposed on the substrate and electrically connected to the device region; an insulating layer disposed between the substrate and the conducting layer; and a carrier substrate, wherein the substrate is disposed on the carrier substrate, and the substrate has a recess extending towards the carrier substrate in at least one of the corner regions.

An embodiment of the invention provides a method for forming a chip package which includes: providing a substrate having a plurality of sides and a plurality of corner regions, wherein each of the corner regions is located at an intersection of at least two of the sides of the substrate, and wherein the substrate has a device region therein; providing a carrier substrate; disposing the substrate on the carrier substrate; forming an insulating layer on the substrate; forming a conducting layer on the insulating layer on the substrate, wherein the conducting layer is electrically connected to the device region; and removing a portion of the substrate from at least one of the corner regions of the substrate to form a recess extending towards the carrier substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

Figure 1A:
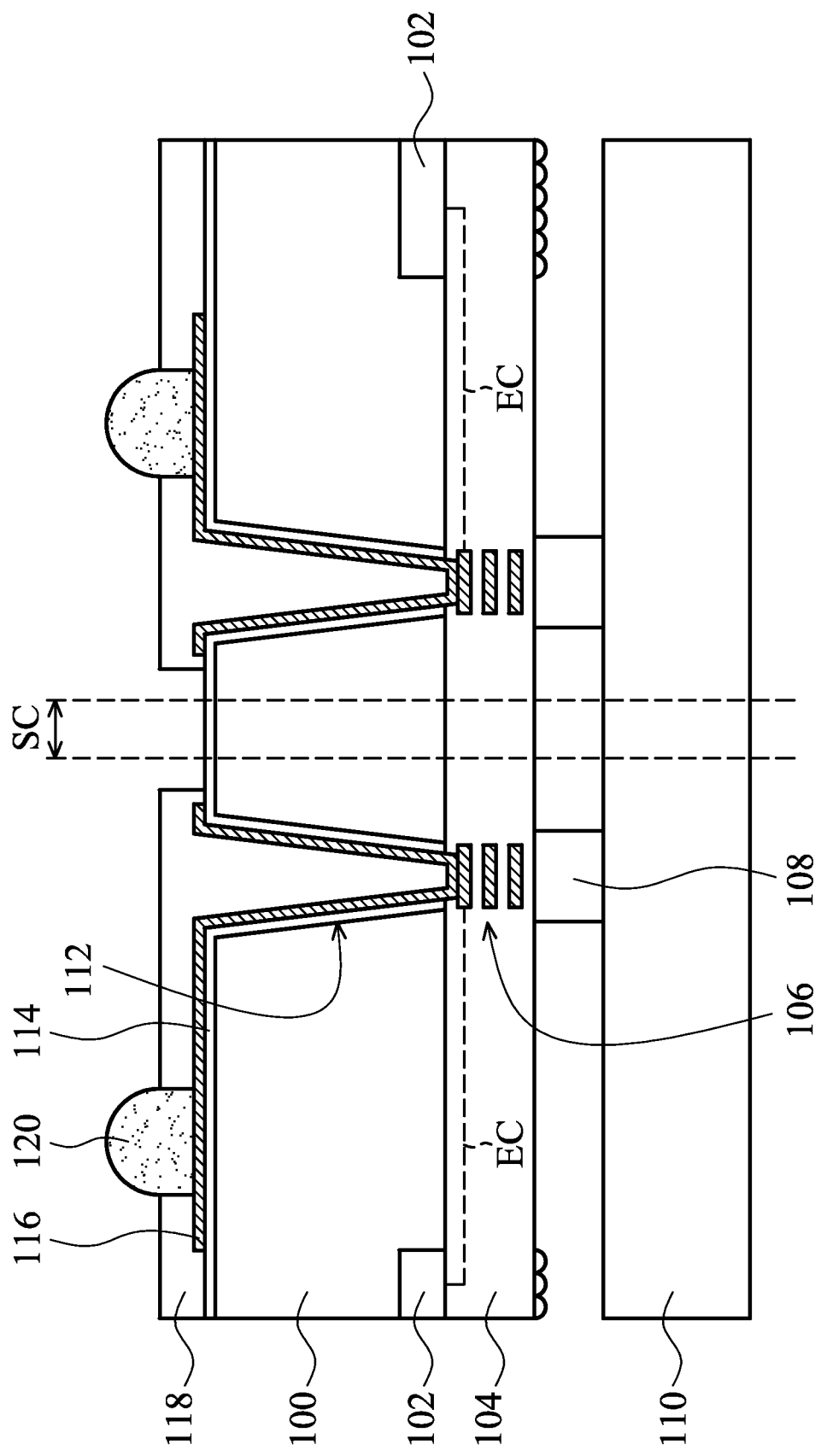
FIGS. 1A-1B are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an image sensor chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1B:
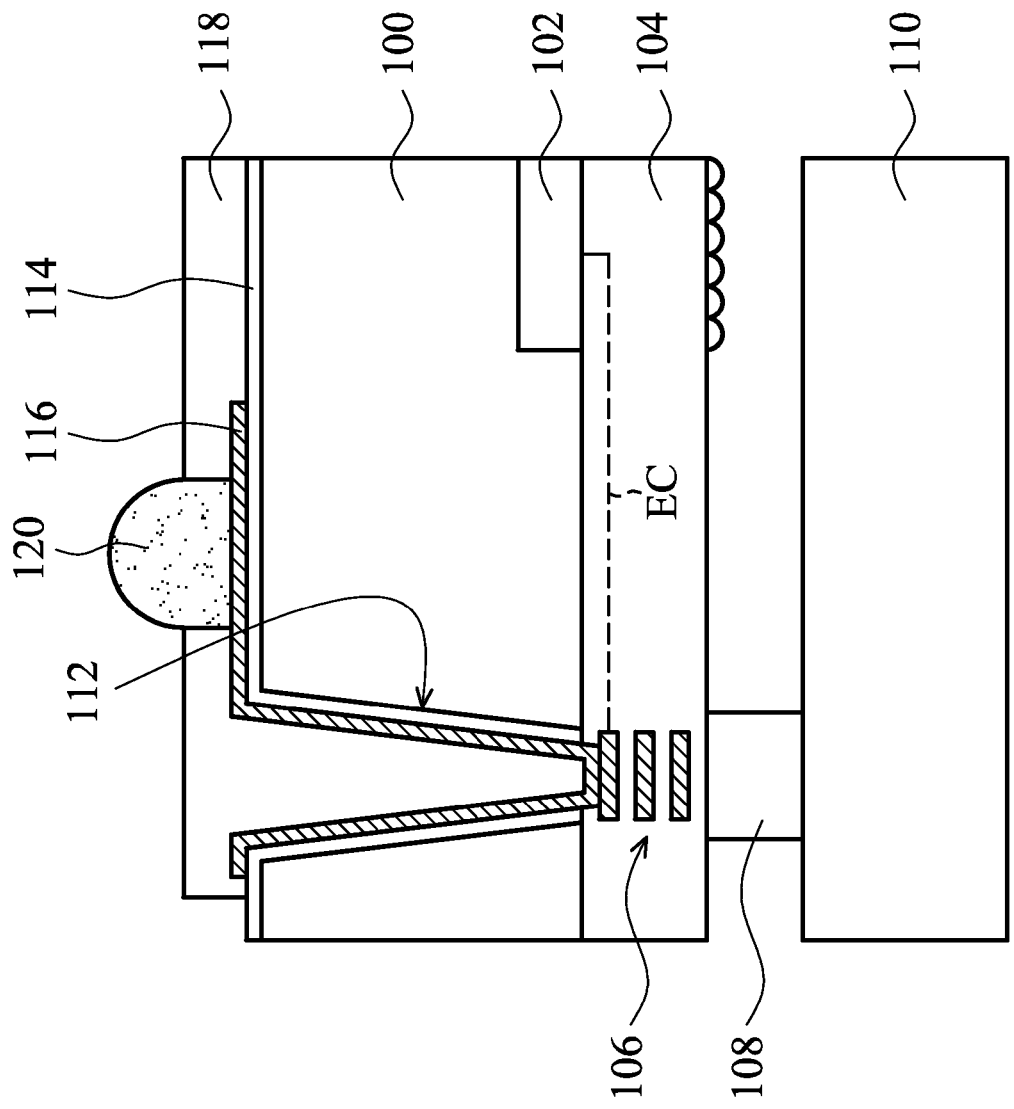

FIGS. 1A-1B are cross-sectional views showing the steps of forming a chip package according to an embodiment of the present invention. In this embodiment, a packaging process of an image sensor chip is taken as an example to illustrate the embodiments of the invention. However, it should be appreciated that the embodiments of the invention may also be used to package other chips.

As shown in FIG. 1A, a substrate 100 is provided. The substrate 100 may be a semiconductor wafer such as a silicon wafer. The substrate may have a plurality of predetermined scribe lines SC defined thereon which define the substrate 100 into a plurality of regions. After subsequent packaging processes and dicing processes are performed, each of the regions becomes a chip package. In each of the regions, at least a device region 102 is formed. In one embodiment, the device region 102 may include an optoelectronic device such as an image sensor device or light emitting device. In another embodiment, the device region 102 may include another electronic device such as micro electro mechanical systems, micro fluidic systems, physical sensors, solar cells, RF circuits, accelerators, gyroscopes, micro actuators, surface acoustic wave devices, pressure sensors, ink printer heads, or power IC modules.

A plurality of conducting pad structures 106 are formed on a surface of the substrate 100, which are located in an insulating layer 104 (or called dielectric layer) on the surface. Each of the conducting pad structure 106 may include a plurality of stacked conducting pads. These stacked conducting pads may be electrically connected to each other (through, for example, vertical conducting structures formed between the stacked conducting pads). Alternatively, these stacked conducting pads may not be electrically connected to each other. In one embodiment, at least one of the conducting pads is electrically connected to the device region 102.

Then, the substrate 100 is disposed on a carrier substrate 110. A plurality of spacer layers 108 may be disposed between the carrier substrate 110 and the substrate 100. The spacer layers 108 and the carrier substrate 110 may surround a plurality of cavities on the substrate 100. There may be at least one device region 102 below each of the cavities. The spacer layer 108 may cover the conducting pad structure 106. In the embodiment where the device region 102 includes an optoelectronic device (such as an image sensor device or light emitting device), a transparent substrate (such as a glass substrate, quartz substrate, or transparent polymer substrate) may be chosen as the carrier substrate 110 to facilitate light to enter the device region 102 or to be emitted from the device region 102. In another embodiment, the spacer layer 108 may not need to be formed.

Then, the substrate 100 may be optionally thinned to facilitate subsequent process steps. For example, the carrier substrate 110 may be used as a support, and the substrate 100 is thinned from the upper surface of the substrate 100. A suitable thinning process is, for example, a mechanical grinding process or chemical mechanical polishing process.

Then, a portion of the substrate 100 is removed to form a hole 112 extending from the upper surface of the substrate 100 towards the conducting pad structure 106. For example, a photolithography process and an etching process may be used to form the hole 112.

Then, a portion of the insulating layer 114 on a bottom of the hole 112 is removed. A portion of the insulating layer 104 is subsequently removed by using, for example, a photolithography process and an etching process, such that at least a portion of the conducting pad structure 106 is exposed.

Then, a patterned conducting layer 116 is formed on the insulating layer 114 on the upper surface of the substrate 100. The material of the conducting layer 116 includes, for example, copper, aluminum, nickel, gold, platinum, or combinations thereof. The formation method for forming the conducting layer 116 includes, for example, a physical vapor deposition process, chemical vapor deposition process, coating process, electroplating process, electroless plating process, or combinations thereof. The conducting layer 116 may extend from the upper surface of the substrate 100 towards the conducting pad structure 116 along a sidewall of the hole 112 and electrically contact with the conducting pad structure 116.

Then, a protection layer 118 is formed on the upper surface of the substrate 100, which is, for example, a solder mask layer. In one embodiment, the protection layer 118 may have openings exposing the conducting layer 116, and a conducting structure 120 may be formed on the exposed conducting layer 116, which is, for example, a solder ball or conducting bump. In one embodiment, the protection layer 118 does not cover the predetermined scribe lines SC. Thus, in a subsequent dicing process, a possible stress issue caused by cutting the protection layer 118 may be reduced. Thus, in one embodiment, after the dicing process is performed, a projection of at least one side of the protection layer 118 disposed on the substrate 100 on the upper surface of the substrate 100 does not overlap with the sides of the substrate 100.

Then, the structure shown in FIG. 1A may be diced along the predetermined scribe lines SC to form a plurality of chip packages separated from each other, as shown in FIG. 1B. In one embodiment, the dicing process may be stepwise performed. For example, the substrate 100 may be first cut, followed by cutting of the carrier substrate 110, wherein the cutting conditions (such as the used blades) used in the two dicing steps may be different. Alternatively, in another embodiment, the carrier substrate 110 may first be cut, followed by the cutting of the substrate 100, wherein the cutting conditions used in the two dicing steps may be different.

Figure 2B:
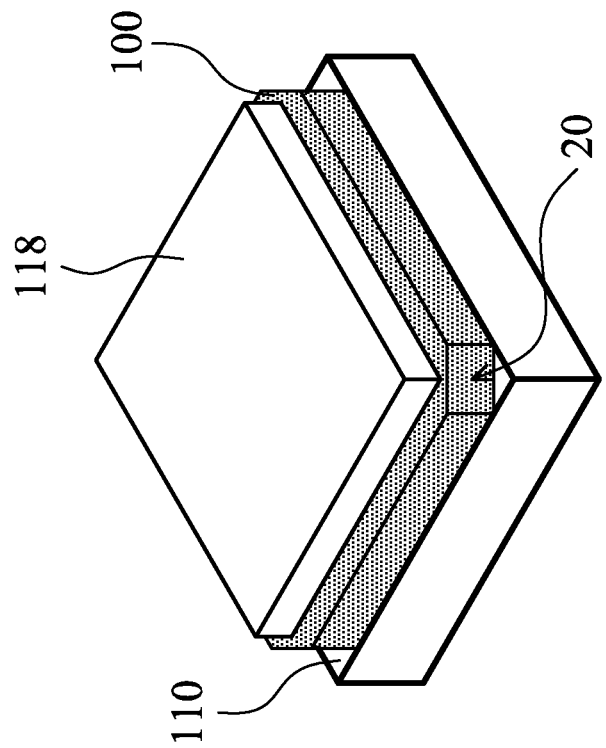
FIGS. 2A and 2B are a top view and a three-dimensional view respectively showing a chip package according to an embodiment of the present invention.
Figure 2A:
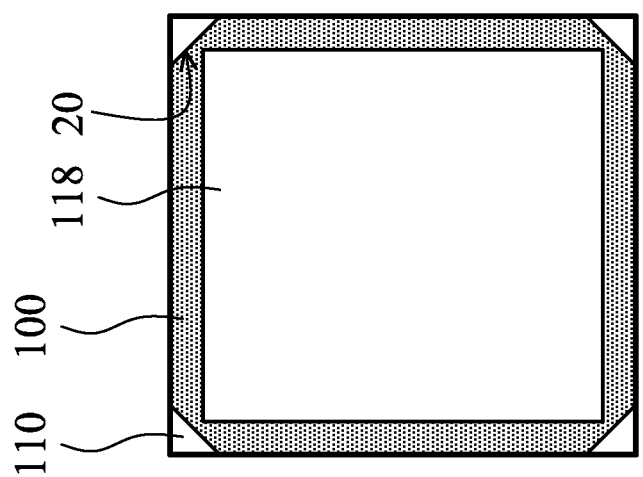

FIGS. 2A and 2B are a top view and a three-dimensional view respectively showing a chip package according to an embodiment of the present invention, wherein same or similar reference numbers are used to designate same or similar elements.

As shown in FIG. 2A, the substrate 100 may have a plurality of sides and a plurality of corner regions, wherein each of the corner regions are located at an intersection of at least two of the sides of the substrate. In one embodiment, a portion of the substrate 100 may be removed from at least one of the corner regions of the substrate 100 to form a recess 20 extending towards the carrier substrate 110. As shown in the embodiment in FIG. 2A, a portion of the substrate 100 may be removed from all of the corner regions of the substrate 100 to form recesses 20 extending towards the carrier substrate 110 or exposing the carrier substrate 110. In one embodiment, in the photolithography process and the etching process of the hole 112, the recess 20 may be simultaneously formed. In another embodiment, the recess 20 may be formed in a patterning process different from that of the hole 112. In another embodiment, the recess 20 may be formed by using a dicing process (or drilling process). In yet another embodiment, a dicing process and an etching process may be used to form the recess 20.

FIG. 2B is a three-dimensional view correspondingly showing the structure in FIG. 2A. After the recesses 20 are formed, the reliability of the chip package is improved and subsequent process steps are facilitated. As shown in FIGS. 2A and 2B, in one embodiment, a sidewall of the recess 20 may incline to at least two sides of the substrate 100. In addition, in the embodiment shown in FIGS. 2A and 2B, a projection of at least one of the sides of the substrate 100 on the upper surface of the carrier substrate 110 overlaps a side of the carrier substrate. That is, a side of the substrate 100 is substantially coplanar with a side of the carrier substrate 110.

Figure 3:
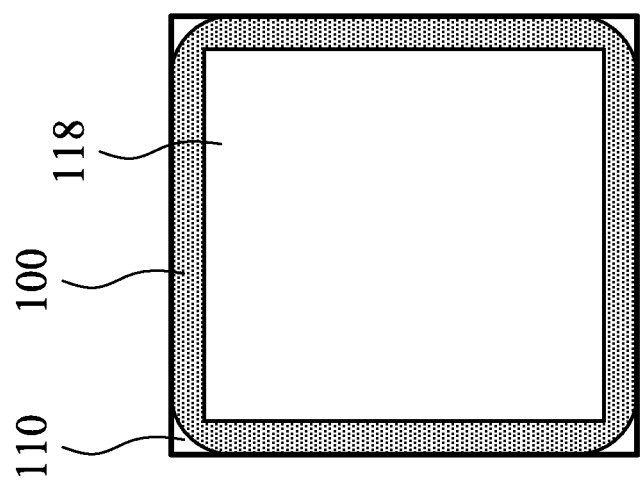
FIG. 3 is a top view showing a chip package according to an embodiment of the present invention.

FIG. 3 is a top view showing a chip package according to an embodiment of the present invention, wherein same or similar reference numbers are used to designate same or similar elements. In one embodiment, the sidewall of the formed recess may have a curved profile.

Figure 4:
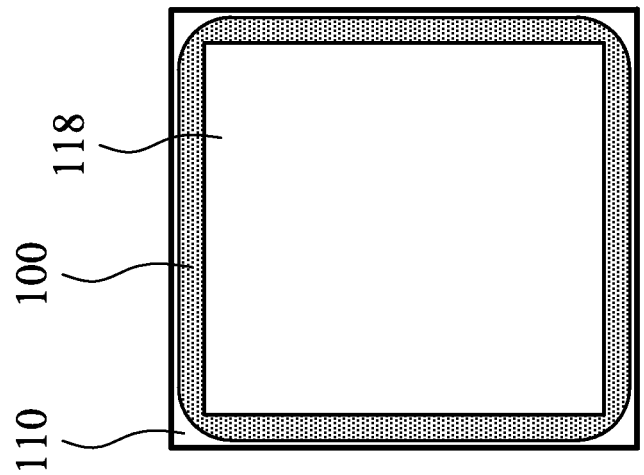
FIG. 4 is a top view showing a chip package according to an embodiment of the present invention.

FIG. 4 is a top view showing a chip package according to an embodiment of the present invention, wherein same or similar reference numbers are used to designate same or similar elements. In one embodiment, through a patterning process, not only may a recess having a curved sidewall be formed in the corner region of the substrate 100, but, a portion of the substrate 100 may be further removed such that a projection of at least one side of the substrate 100 on the upper surface of the carrier substrate 110 does not overlap with any side of the carrier substrate 110. In other words, the sides of the substrate 100 retreat with respect to the sides of the carrier substrate 110. In this embodiment, reliability of the chip package may be improved.

In one embodiment, the retreated sides of the substrate 100 and the recess may be simultaneously formed in the same photolithography and etching processes. In another embodiment, the retreated sides of the substrate 100 and the recess may be formed by using a dicing process. For example, a dicing process may be performed along the plurality of predetermined scribe lines SC of the substrate 100 by using a blade having a larger width to remove a portion of the substrate 100. Then, a dicing process may be performed along the predetermined scribe lines SC of the substrate 100 by using a blade having a smaller width to cut through the substrate 100 and the carrier substrate 110. Thus, the side of the substrate 100 may retreat with respect to the side of the carrier substrate 110.

Figure 5B:
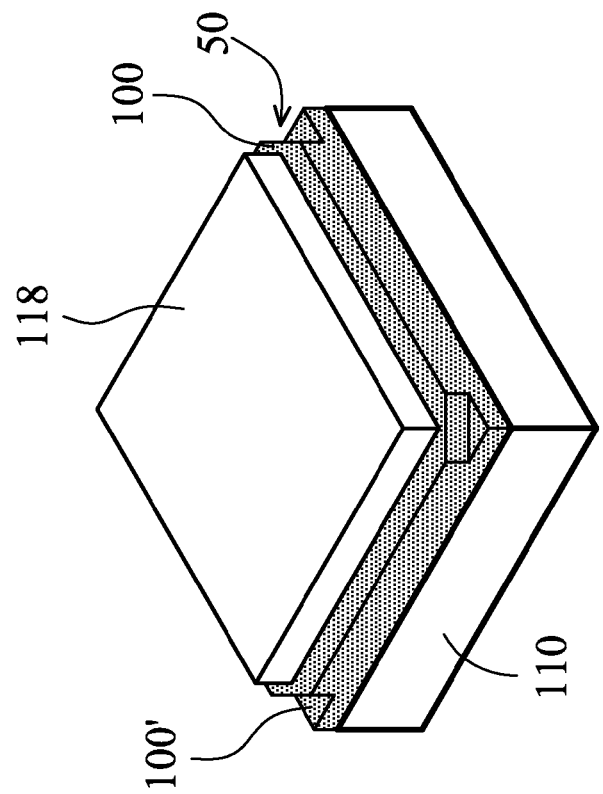
FIGS. 5A and 5B are a top view and a three-dimensional view respectively showing a chip package according to an embodiment of the present invention.
Figure 5A:
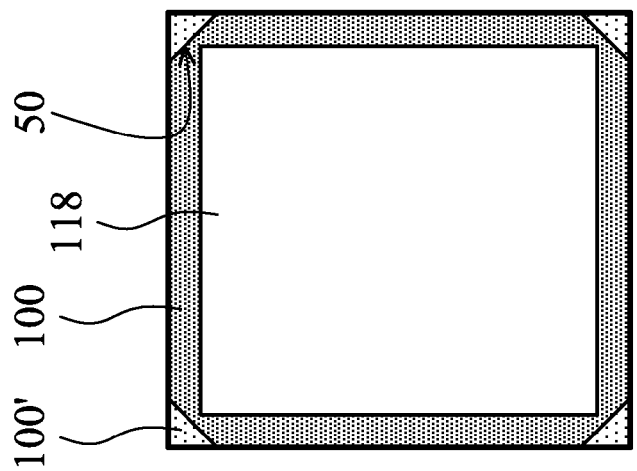

FIGS. 5A and 5B are a top view and a three-dimensional view respectively showing a chip package according to an embodiment of the present invention, wherein same or similar reference numbers are used to designate same or similar elements. In this embodiment, the formed recess 50 may only extend towards the carrier substrate 110 without exposing the carrier substrate 110. As shown in FIGS. 5A and 5B, the recess 50 exposes the substrate 100' having a thinner thickness.

Embodiments of the invention may have other variations. For example, in an embodiment similar to that shown in FIG. 1A, the spacer layer 108 may extend across the scribe line SC and extend under the conducting pad structure 106 of a neighboring die. In this case, the recess in the corner region of the substrate of the obtained chip package after being diced may expose, for example, the spacer layer 108.

In the embodiments of the invention, through a variety of patterning process (such as an etching process and/or a dicing process), the substrate may have a recess extending towards the carrier substrate in the corner region, which may help to improve reliability of the chip package. In addition, in the embodiments of the invention, through the pattern design of the protection layer, the reliability of the chip package may also be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a plurality of sides and a plurality of corner regions, wherein each of the corner regions is located at an intersection of at least two of the sides of the substrate;
   a device region formed in the substrate;
   a conducting layer disposed on the substrate and electrically connected to the device region;
   a conducting structure disposed on and covering a portion of the conducting layer;
   an insulating layer disposed between the substrate and the conducting layer;
   a protection layer disposed over the conducting layer, wherein the protection layer is configured to completely cover the conducting layer other than at the portion of the conducting layer covered by the conducting structure; and
   a carrier substrate, wherein the substrate is disposed on the carrier substrate, and the substrate has a recess extending towards the carrier substrate in at least one of the corner regions, wherein the recess vertically exposes the carrier substrate viewed in a direction perpendicular to the substrate and the carrier substrate.

2. The chip package as claimed in claim 1, wherein a sidewall of the recess inclines to at least two of the sides of the substrate.

3. The chip package as claimed in claim 1, wherein the recess has a sidewall, and the sidewall has a curved profile.

4. The chip package as claimed in claim 1, wherein a projection of at least one of the sides of the substrate on a surface of the carrier substrate overlaps with at least one side of the carrier substrate.

5. The chip package as claimed in claim 1, wherein a projection of at least one of the sides of the substrate on a surface of the carrier substrate does not overlap with any side of the carrier substrate.

6. The chip package as claimed in claim 1, wherein a projection of at least one side of the protection layer on a surface of the substrate does not overlap with the sides of the substrate.

7. The chip package as claimed in claim 1, further comprising a spacer layer disposed between the substrate and the carrier substrate.

8. The chip package as claimed in claim 7, wherein the recess exposes the spacer layer.

9. The chip package as claimed in claim 1, further comprising a hole extending from a surface of the substrate towards the carrier substrate, wherein a portion of the conducting layer is located in the hole.

10. A method for forming a chip package, comprising:
    providing a substrate having a plurality of sides and a plurality of corner regions, wherein each of the corner regions is located at an intersection of at least two of the sides of the substrate, and wherein the substrate has a device region therein;
    providing a carrier substrate;
    disposing the substrate on the carrier substrate;
    forming an insulating layer on the substrate;
    forming a conducting layer on the insulating layer on the substrate, wherein the conducting layer is electrically connected to the device region;
    forming a conducting structure disposed on and covering a portion of the conducting layer;
    forming a protection layer over the conducting layer, wherein the protection layer is configured to completely cover the conducting layer other than at the portion of the conducting layer covered by the conducting layer; and removing a portion of the substrate from at least one of the corner regions of the substrate to form a recess extending towards the carrier substrate, wherein the recess vertically exposes the carrier substrate viewed in a direction perpendicular to the substrate and the carrier substrate.

11. The method for forming a chip package as claimed in claim 10, further comprising performing a dicing process along a plurality of predetermined scribe lines of the substrate to form a plurality of chip packages separated from each other.

12. The method for forming a chip package as claimed in claim 11, wherein the dicing process comprises cutting the substrate and then cutting the carrier substrate or cutting the carrier substrate and then cutting the substrate.

13. The method for forming a chip package as claimed in claim 10, wherein the step of forming the recess comprises removing the portion of the substrate by using a dicing process, an etching process, or combinations thereof.

14. The method for forming a chip package as claimed in claim 10, further comprising removing a portion of the substrate such that a projection of at least one of the sides of the substrate on a surface of the carrier substrate does not overlap with any side of the carrier substrate.

15. The method for forming a chip package as claimed in claim 10, further comprising:

removing a portion of the substrate from a surface of the substrate to form a hole extending towards the carrier substrate; and after the hole is formed, forming the insulating layer on the substrate and forming the conducting layer on the insulating layer, wherein a portion of the insulating layer and a portion of the conducting layer are located in the hole.

16. The method for forming a chip package as claimed in claim 15, wherein the hole and the recess are simultaneously formed.

17. The method for forming a chip package as claimed in claim 10, wherein the step of forming the recess comprises:

performing a dicing process along a plurality of predetermined scribe lines of the substrate by using a first blade to remove a portion of the substrate; and performing a second dicing process along the predetermined scribe lines of the substrate by using a second blade to cut through the substrate and the carrier substrate, wherein a width of the first blade is larger than that of the second blade.

18. The method for forming a chip package as claimed in claim 10, wherein a projection of at least one side of the protection layer on the surface of the substrate does not overlap with the sides of the substrate.

19. A chip package, comprising:

a substrate having a plurality of sides and a plurality of corner regions, wherein each of the corner regions is located at an intersection of at least two of the sides of the substrate;

a device region formed in the substrate;

a conducting layer disposed on the substrate and electrically connected to the device region;

an insulating layer disposed between the substrate and the conducting layer; and a carrier substrate, wherein the substrate is disposed on the carrier substrate, and the substrate has a recess extending towards the carrier substrate in at least one of the corner regions to form a truncated corner, wherein the recess is formed only in the at least one of the corner regions, and the recess vertically exposes the carrier substrate viewed in a direction perpendicular to the substrate and the carrier substrate.

* * * * *